US012222805B2

(12) United States Patent
Springberg (10) Patent No.: US 12,222,805 B2
(45) Date of Patent: *Feb. 11, 2025

(54) COMPRESSION-BASED DATA OPERATIONS IN A MEMORY DEVICE (71) Applicant: Micron Technology, Inc., Boise, ID (US)

(72) Inventor: David Matthew Springberg, Fort Collins, CO (US)

(73) Assignee: Micron Technology, Inc., Boise, ID (US)

( * ) Notice: Subject to any disclaimer, the term of this patent is extended or adjusted under 35 U.S.C. 154(b) by 174 days.

This patent is subject to a terminal disclaimer.

(21) Appl. No.: 18/110,684

(22) Filed: Feb. 16, 2023

(65) Prior Publication Data
US 2023/0195571 A1 Jun. 22, 2023

Related U.S. Application Data (63) Continuation of application No. 17/216,087, filed on Mar. 29, 2021, now Pat. No. 11,599,414.

(51) Int. Cl.
G06F 11/10 (2006.01)
G06F 3/06 (2006.01)
G11C 16/04 (2006.01)
G11C 16/10 (2006.01)
G11C 16/26 (2006.01)

(52) U.S. Cl.
CPC ........ *G06F 11/1068* (2013.01); *G06F 3/0608* (2013.01); *G06F 3/0619* (2013.01); *G06F 3/0659* (2013.01); *G06F 3/0679* (2013.01); *G11C 16/0483* (2013.01); *G11C 16/10* (2013.01); *G11C 16/26* (2013.01)

(58) Field of Classification Search
CPC ............. G06F 11/1012; G06F 11/1048; G06F 11/1068; G06F 11/1072; G06F 3/0608; G06F 3/0619; G06F 3/0659; G06F 3/0679; G11C 11/5628; G11C 16/0483; G11C 16/10; G11C 16/26; G11C 29/40; G11C 29/42; G11C 7/1006
See application file for complete search history.

(56) References Cited

U.S. PATENT DOCUMENTS

| 10,176,886 B1* | 1/2019 | Spencer | G06F 11/1012 |
| 2011/0320915 A1* | 12/2011 | Khan | H03M 13/353 |
| | | | 714/763 |
| 2017/0093440 A1* | 3/2017 | Camp | G06F 3/0689 |
| 2017/0269839 A1* | 9/2017 | Alrod | G06F 3/0679 |
| 2022/0308959 A1 | 9/2022 | Springberg | |

FOREIGN PATENT DOCUMENTS

CN 115148257 A 10/2022

* cited by examiner

*Primary Examiner* — Albert Decady
*Assistant Examiner* — Enamul M Kabir
(74) *Attorney, Agent, or Firm* — Schwegman Lundberg & Woessner, P.A.

(57) ABSTRACT

A processing device receives a request to write data to a memory device. The processing device generates a codeword based on the data. The codeword comprises the data and error correction code. The processing device generates a compressed codeword by compressing the codeword. The processing device stores the compressed codeword on a page of the memory device.

20 Claims, 7 Drawing Sheets

COMPRESSION-BASED DATA OPERATIONS IN A MEMORY DEVICE

PRIORITY APPLICATION

This application is a continuation of U.S. application Ser. No. 17/216,087, filed Mar. 29, 2021, which is incorporated herein by reference in its entirety.

TECHNICAL FIELD

Embodiments of the disclosure relate generally to memory sub-systems and, more specifically, to compression-based data operations in a memory device.

BACKGROUND

A memory sub-system can include one or more memory devices that store data. The memory components can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to performing compression-based data operations in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of a non-volatile memory device is a negative-and (NAND) memory device. Other examples of non-volatile memory devices are described below in conjunction with FIG. 1. Some memory devices, such as NAND memory devices, include an array of memory cells (e.g., flash cells) to store data. Memory cells in these devices can be grouped as pages that can refer to a logical unit of the memory device used to store data.

A controller of the memory sub-system (also referred to as a "memory sub-system controller") can receive commands or operations from the host system and can convert the commands or operations into instructions or appropriate commands to execute data operations on the memory device. The memory sub-system controller can utilize error-correcting code (ECC) to detect and correct corrupted user data stored by a memory device. In storing data on a memory device, the memory sub-system controller can combine user data with ECC and other information to form a codeword.

Page sizes in NAND devices continue to be decreased to reduce costs. As page sizes are decreased, the amount of spare storage space on NAND devices for storing ECC is decreased. As a result, the ability of memory sub-systems to correct errors is reduced, which impacts the error rate of the NAND device. In addition, market demand for larger logical block sizes in memory devices is increasing.

Traditionally, compression is used in memory devices to increase capacity and reduce data transfer lengths. Conventionally approaches to compression involve compressing user data before it is stored on the memory device. However, conventional approaches to data compression within a memory device ignore additional data that is stored with user data such as ECC and metadata.

Aspects of the present disclosure address the forgoing issues with memory device capacity by incorporating a compression engine into a datapath of a controller of a memory sub-system. The compression engine includes a compressor for compressing data to be stored on a memory device and a decompressor for decompressing compressed data stored by the memory device. Rather than performing compression in the main user data path as done in conventional approaches, codewords are compressed and stored instead of merely just user data. Accordingly, compression is performed for write operations subsequent to encoding incoming user data with ECC and decompression is performed for read operations prior to decoding codewords read from a memory device. Multiple instances of the compressor and decompressor can be used in the datapath to meet performance specifications.

In an example, a request to store user data on a memory device is received by a memory sub-system from a host system. In this example, a controller in the memory sub-system includes an encoder to generate a codeword by encoding user data with ECC. The controller further includes a compressor to compresses the codeword. The controller stores the compressed codeword on a page of the memory device. The compressed codeword can be stored on the page with one or more additional compressed codewords. The compressed codeword length can be stored in a header of the codeword to enable a decompressor to decompress the codeword.

In another example, a request to read user data from a memory device is received by a memory sub-system from a host system. A controller of the memory sub-system reads a corresponding compressed codeword from the memory device. A decompressor of the controller decompresses the compressed codeword, and a decoder decodes the un-compressed codeword. The controller accesses the user data and provides it as output to the host system.

Incorporating data compression into the memory sub-system controller path in this manner improves the code rate thereby allowing for a higher error rate that can be traded off to reduce program latency and increase endurance. Program latency and endurance are very important considerations in a memory device given their affect on wire performance and drive writes per day (DWPD) specifications. In addition, larger logical units can be used within a NAND device without any special NAND page layout changes. Also, ECC size can be increased in view of the compression thereby furthering the benefits referenced above.

Figure 1:
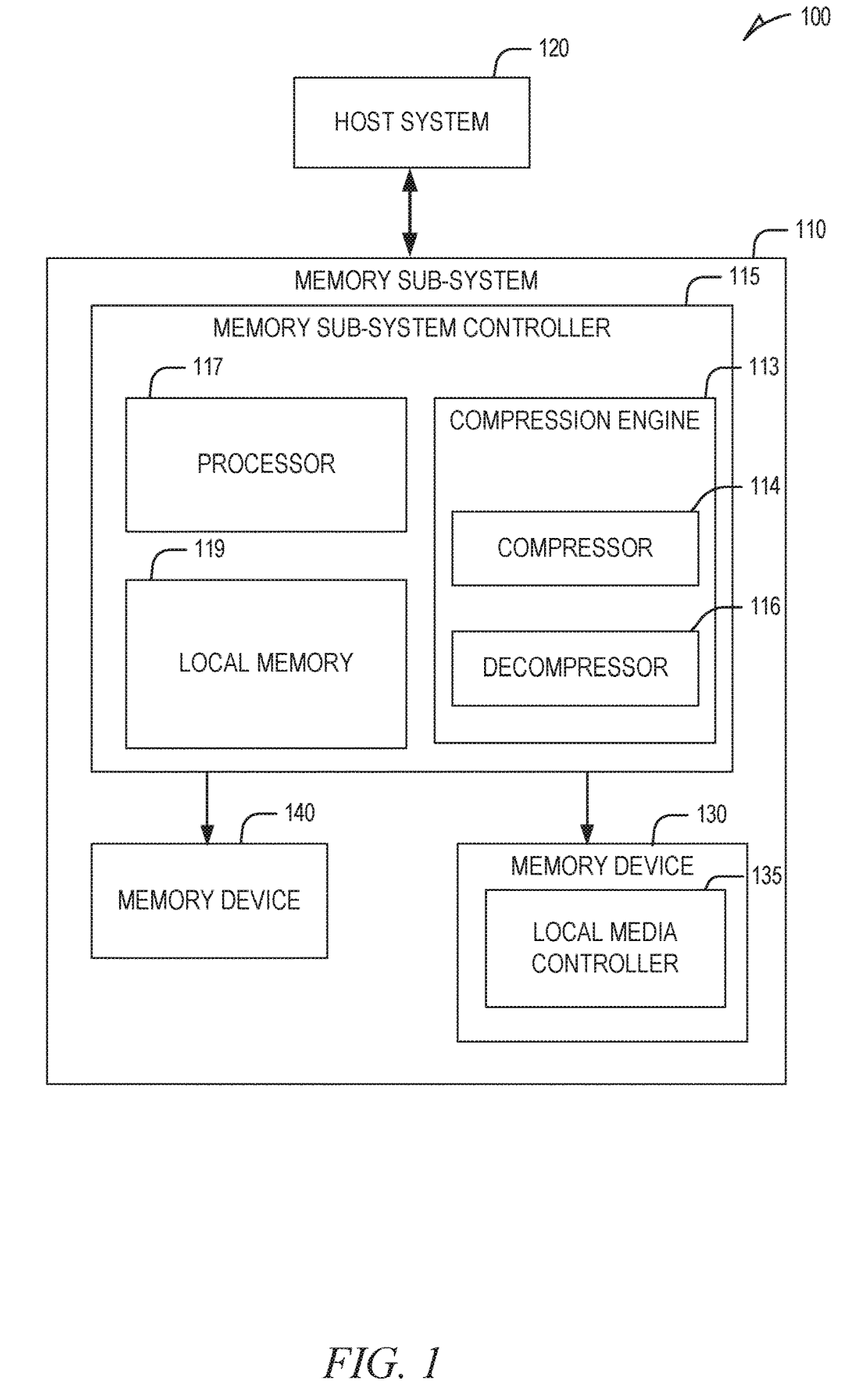
FIG. 1 is a block diagram illustrating an example computing environment that includes a memory sub-system, in accordance with some embodiments of the present disclosure.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include multiple host systems that are coupled to one or more memory sub-systems 110. In some embodiments, the host system 120 is coupled to different types of memory sub-system 110. FIG. 1 illustrates an example host system 120 that is coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a host interface. Examples of a host interface include, but are not limited to, a SATA interface, a PCIe interface, USB interface, Fibre Channel, Serial Attached SCSI (SAS), Small Computer System Interface (SCSI), a double data rate (DDR) memory bus, a DIMM interface (e.g., DIMM socket interface that supports Double Data Rate (DDR)), Open NAND Flash Interface (ONFI), Double Data Rate (DDR), Low Power Double Data Rate (LPDDR), or any other interface. The host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include NAND type flash memory and write-in-place memory, such as a three-dimensional (3D) cross-point memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 130 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. For example, memory cells in NAND memory devices are connected horizontally at their control gates to a word line to form a page. With some types of memory (e.g., NAND), pages can be grouped to form blocks. Additionally, word lines within a memory device can be organized into multiple word line groups, each of which includes one or more word lines, though each word line group includes fewer word lines than are included in a block.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special-purpose logic circuitry (e.g., a field programmable gate array (FPGA), an application-specific integrated circuit (ASIC), etc.), or another suitable processor.

The memory sub-system controller 115 can include a processor 117 (processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and the like. The local memory 119 can also include ROM for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and ECC operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 and convert responses associated with the memory devices 130 and/or the memory device 140 into information for the host system 120.

In some embodiments, the memory devices 130 include local media controller 135 that operates in conjunction with memory sub-system controller 115 to execute operations on one or more memory cells of the memory devices 130.

The memory sub-system controller 115 also includes at least one compression engine 113. Depending on the embodiment, the compression engine 113 can include hardware (e.g., a processing device, circuitry, dedicated logic, programmable logic, microcode, hardware of a device, an integrated circuit, etc.), software (e.g., instructions run or executed on a processing device), or a combination thereof.

The compression engine 113 includes a compressor 114 for compressing data to be stored on a memory device and a decompressor 116 for decompressing compressed data stored by the memory devices 130 or 140. More specifically, the compressor 114 compresses codewords generated based on user data and the decompressor 116 decompresses compressed codewords read from the memory devices 130 or 140. Each codeword comprises user data, ECC generated based on the user data, and metadata. Compression is performed for write operations subsequent to encoding user data with ECC and decompression is performed for read operations prior to decoding codewords read from a memory device. Although FIG. 1 illustrates only a single compressor 114 and decompressor 116, it shall be appreciated that multiple instances of the compressor 114 and decompressor 116 can be included in the compression engine 113.

In some embodiments, the memory sub-system controller 115 includes at least a portion of the data compression engine 113. For example, the memory sub-system controller 115 can include a processor 117 (processing device) configured to execute instructions stored in local memory 119 for performing the operations described herein. In some embodiments, at least a portion of the data compression engine 113 is part of the host system 120, an application, or an operating system.

Figure 2A:
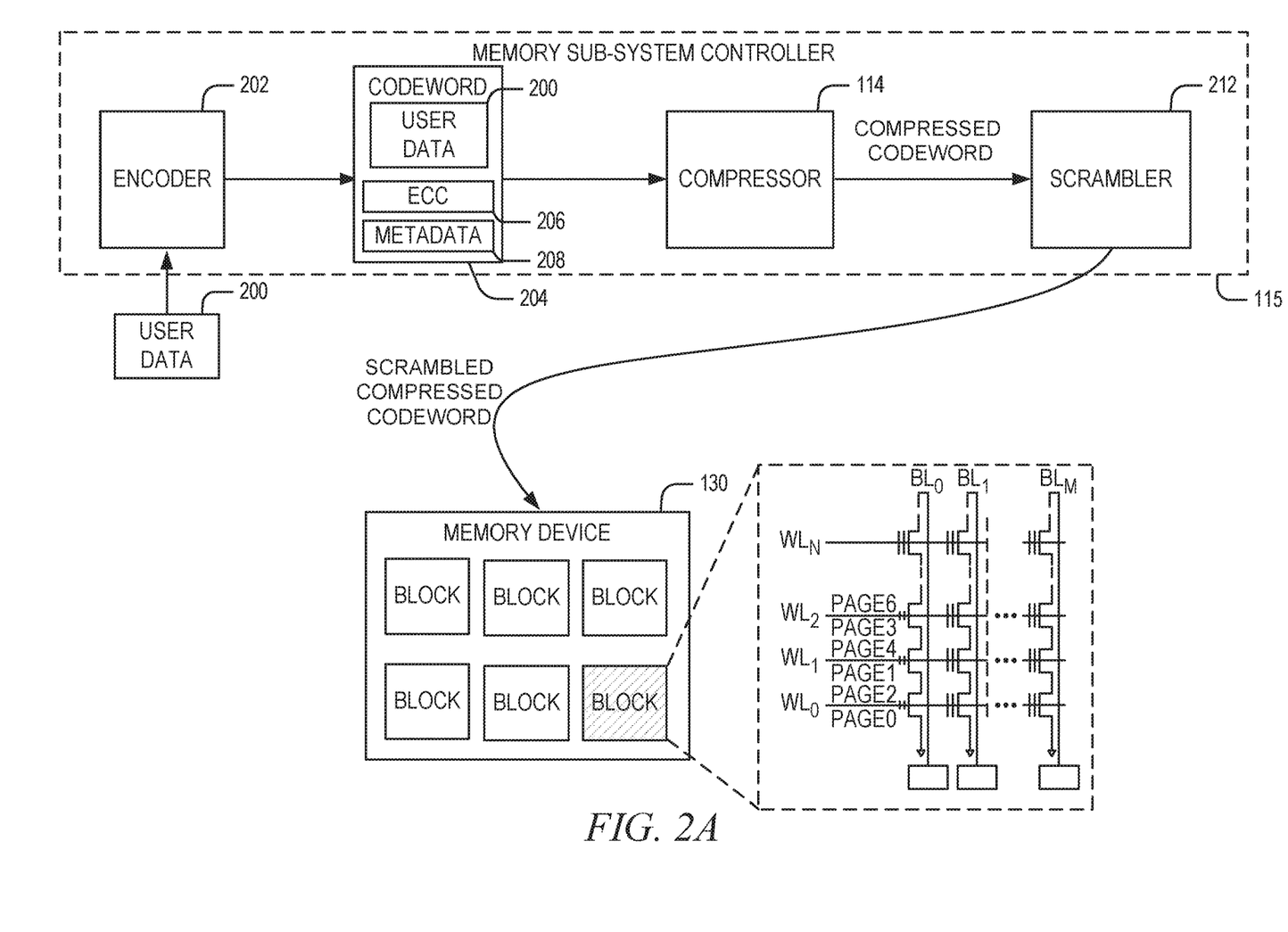
FIGS. 2A and 2B are block diagrams illustrating an example memory sub-system controller architecture for performing data operations on a memory device using compression, in accordance with some embodiments of the present disclosure.
Figure 2B:
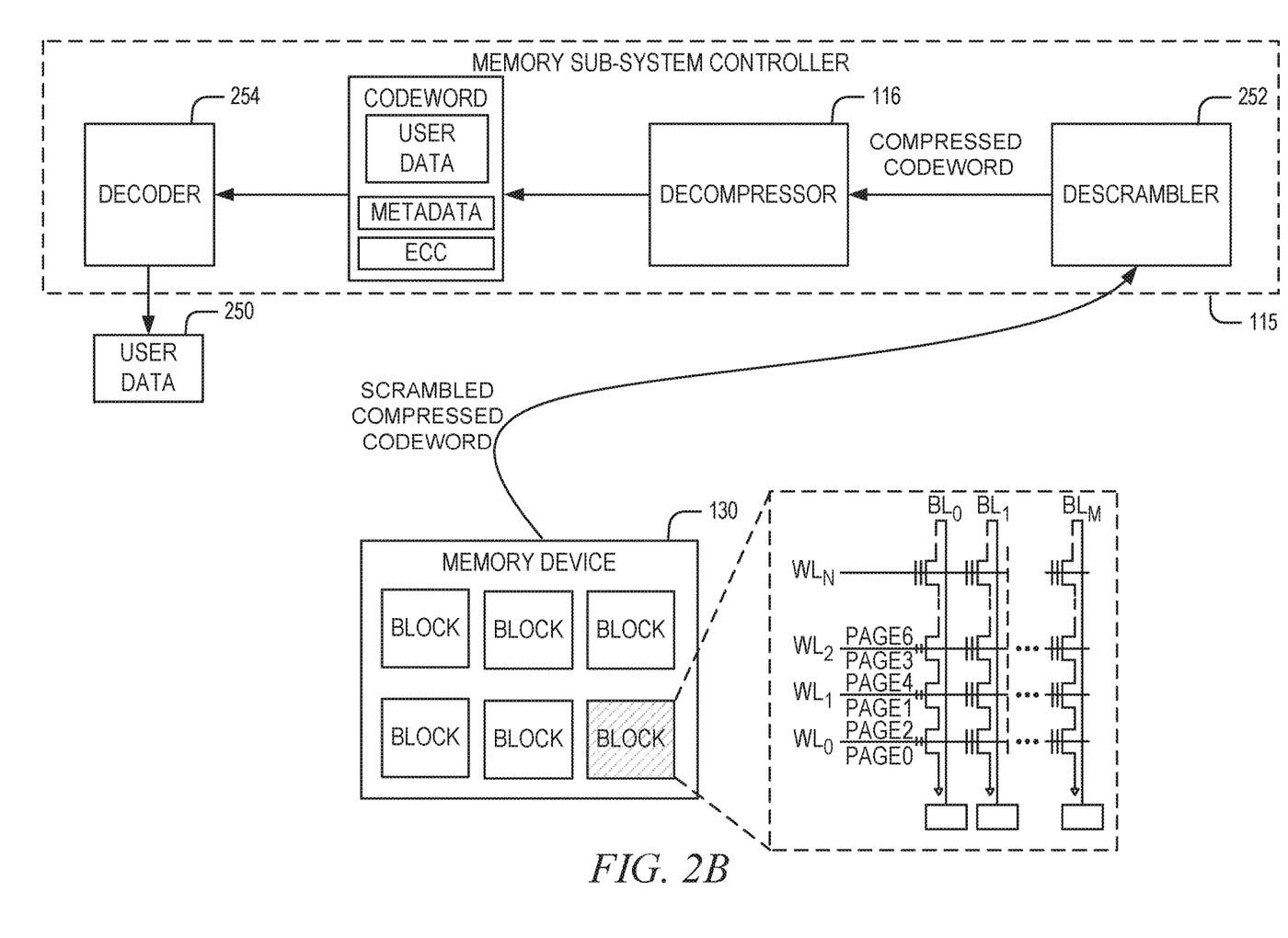

FIGS. 2A and 2B are block diagrams illustrating an example memory sub-system controller architecture for performing data operations on a memory device using compression, in accordance with some embodiments of the present disclosure. In the example illustrated in FIGS. 2A and 2B, the memory device 130 is a NAND memory device that includes multiple memory blocks. As shown, a NAND block includes an array (2D or 3D) of pages (rows) and strings (columns). Each NAND cell includes a transistor, and within each cell, data is stored as the threshold voltage of the transistor, based on the logical value of the cell (e.g., 0 or 1). Strings are connected within the NAND block to allow storage and retrieval of data from selected cells. NAND cells in the same column are connected in series to form a bit line (BL). All cells in a bit line are connected to a common ground on one end and a common sense amplifier on the other for reading the threshold voltage of one of the cells. NAND cells are connected horizontally at their control gates to a word line (WL) to form a page. A page is a set of connected cells that share the same word line and is the minimum unit to program.

With reference to FIG. 2A, an example is illustrated in which a request to write user data 200 to the memory device 130 is received from by the memory sub-system controller 115 from the host system 120. In response to the request, an encoder 202 encodes the user data 200 with error correction code (ECC) 206. The encoder 202 can use one of several known ECC techniques (e.g., low-density parity check (LDPC)) to generate the ECC 206.

The memory sub-system controller 115 (e.g., firmware of the memory sub-system controller 115) generates a codeword 204 that includes the user data 200, the ECC 206, and metadata 208. The metadata 208 can include a data address (e.g., an LBA) and control information. The compressor 114 compresses the codeword 204 to generate a compressed codeword 204. The compressor 114 can use one of many known general compression algorithms to compress the codeword 204 such as LZ77 or LZ78.

The compressed codeword 204 is provided to a scrambler 212 and the scrambler 212 scrambles the compressed codeword 204. In scrambling the compressed codeword 204, the scrambler 212 randomizes bits to insure a DC balanced signal without long runs of 1s or 0s. The memory sub-system controller 115 stores the scrambled compressed codeword 204 on a page of the memory device 130. The memory sub-system controller 115 can store additional scrambled compressed codewords on the page. The memory sub-system controller 115 can update the header of at least one of the compressed codewords to specify a compression length to aid in decompression of the codewords.

With reference to FIG. 2B, an example is illustrated in which a request to read user data 250 from the memory device 130 is received by the memory sub-system controller 115 from the host system 120. A scrambled compressed codeword corresponding to the requested user data 250 is read from a page of the memory device 130 by the memory sub-system controller 115.

A descrambler 252 descrambles the compressed codeword and provides the compressed codeword to the decompressor 116. The decompressor 116 decompresses the compressed codeword and provides the decompressed codeword to a decoder 254. The decoder 254 decodes the codeword to detect and correct any corrupted data in the user data 250 read from the memory device 130. The decoder 254 provides the user data 250 as output, which is provided to the host system 120.

Figure 3:
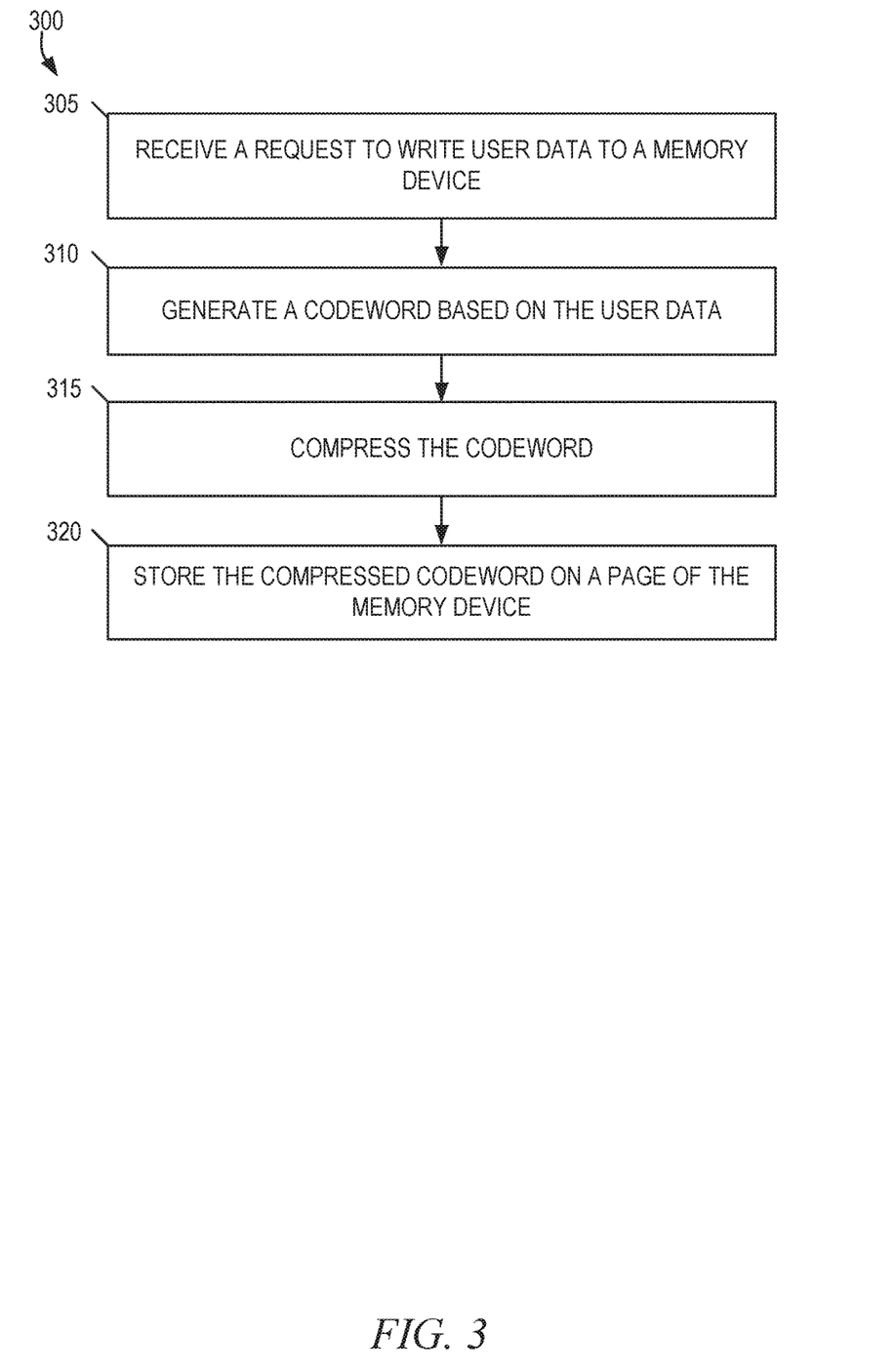
FIGS. 3 and 4 are flow diagrams illustrating an example method for writing data to a memory device using compression, in accordance with some embodiments of the present disclosure.

FIG. 3 is a flow diagram illustrating an example method 300 for programming data to a memory device by communicating indicators of target charge levels to the memory device, in accordance with some embodiments of the present disclosure. The method 300 can be performed by a processing device that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the processing device includes the compression engine 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 305, the processing device receives a request to write user data to a memory device (e.g., the memory device 130). The write request can be received from or be based on a request or command received from a host system (e.g., the host system 120).

The processing device generates a codeword based on the user data, at operation 310. The codeword includes the user data, ECC generated based on the user data, and metadata. The processing device generates a compressed codeword by compressing the codeword, at operation 315. The processing device can use one of several known compression techniques to compress the codeword. The processing device, at operation 320, stores the compressed codeword on a page of the memory device.

Figure 4:
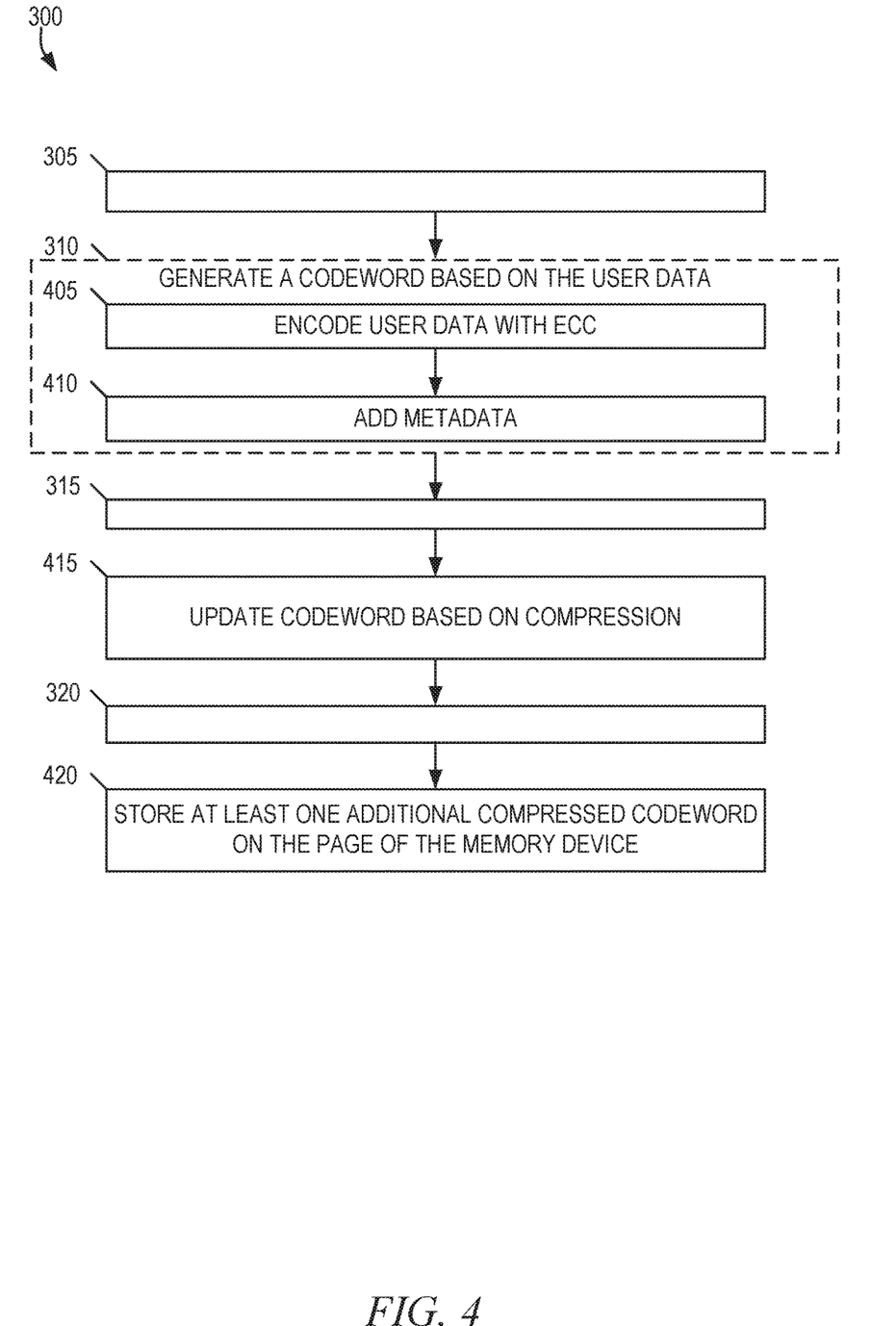

As shown in FIG. 4, the method 300 can include operations 405, 410, 415, and 420, in some embodiments. Consistent with these embodiments, the operations 405 and 410 can be performed as part of the operation 310 where the processing device generates the codeword. At operation 405, the processing device encodes the user data with ECC. In encoding the user data with ECC, the processing device can use one of several known ECC techniques (e.g., LDPC). The processing devices adds metadata associated with the encoded user data, at operation 410, to form the codeword. The metadata includes information about the codeword that the memory sub-system controller 115 uses in data operations.

Consistent with these embodiments, the operation 415 can be performed subsequent to operation 315 where the processing device compresses the codeword. At operation 415, the processing device updates the codeword to include an indicator of compression length. For example, the processing device can add the compression length to a header of the codeword. The compression length is used when the codeword is read from the memory device to aid in decompressing the codeword.

Consistent with these embodiments, the operation 420 can be performed subsequent to or in parallel with operation 320 where the processing device stores the compressed keyword to the page of the memory device. At operation 420, the processing device stores at least one additional compressed codeword on the page of the memory device along with the compressed codeword stored on the memory device.

In an example, the memory device has an 8 KB page size and each compressed codeword is 4 KB. In this example, the processing device causes a first compressed codeword to be written to a first location on the page corresponding to a first LBA (at operation 320) and the processing device causes a second compressed codeword to be written to a second location on the page corresponding to a second LBA (at 420).

Figure 5:
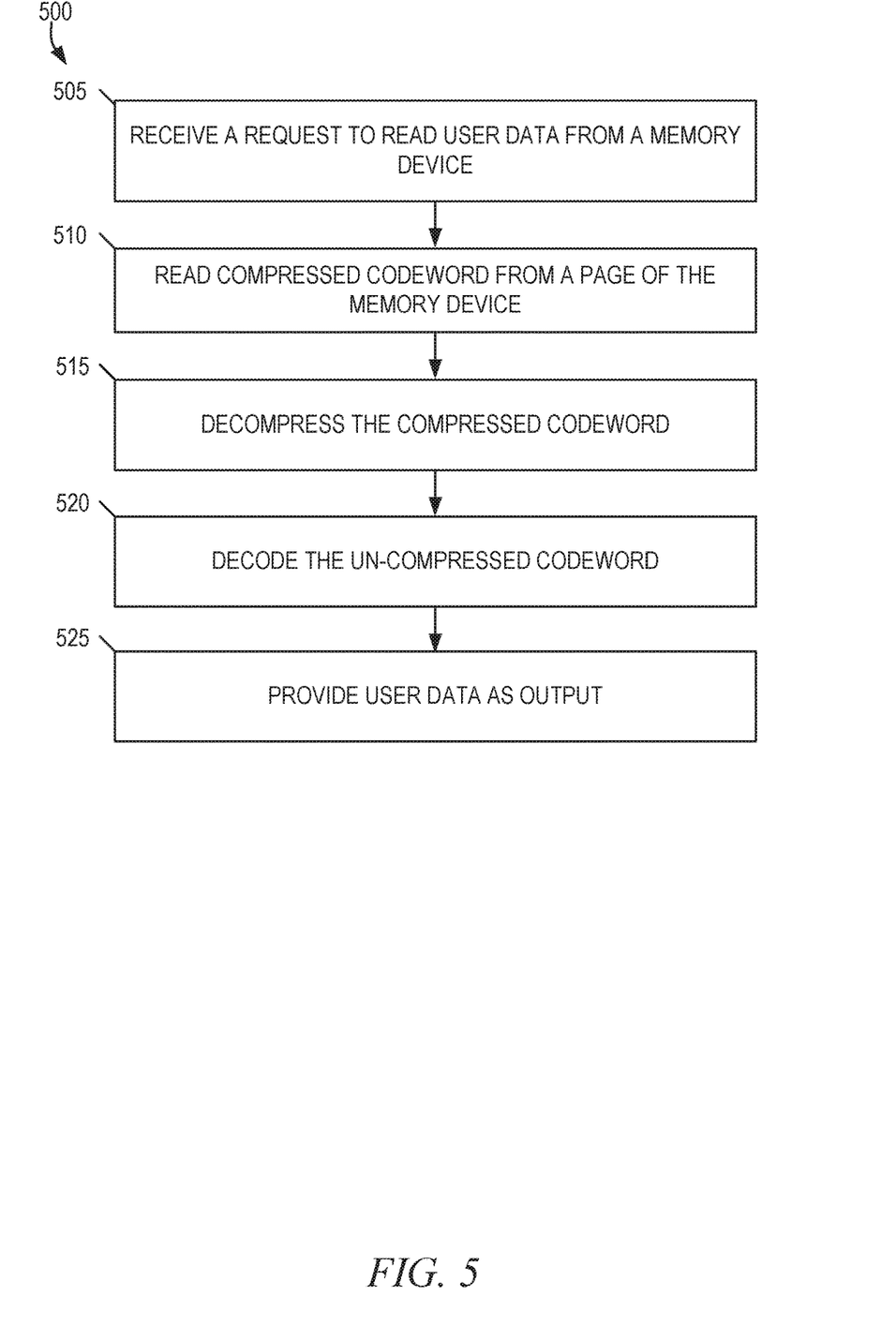
FIG. 5 is a flow diagram illustrating an example method for reading compressed data from a memory device, in accordance with some embodiments of the present disclosure.

FIG. 5 is a flow diagram illustrating an example method 500 for programming data to a memory device by communicating indicators of target charge levels to the memory device, in accordance with some embodiments of the present disclosure. The method 500 can be performed by a processing device that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the processing device includes the compression engine 113 of FIG. 1. Although processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are made use of in every embodiment. Other process flows are possible.

At operation 505, the processing device receives a request to read user data from a memory device (e.g., the memory device 130). The read request can be received from or be based on a request or command received from a host system (e.g., the host system 120).

The processing device, at operation 510, reads a compressed encoded codeword from a page of the memory device. The codeword comprises the user data, ECC, and metadata. The processing device decompresses the compressed codeword, at operation 515. In decompressing the compressed codeword, the processing device can access a compression length from a header of the compressed codeword and decompress the compressed codeword based on the compression length.

The processing device decodes the un-compressed codeword, at operation 520. In decoding the un-compressed codeword, the processing device can detect whether there is any corrupted data in the requested user data based on the ECC. If any data corruption is detected, the processing device corrects the data corruption before providing the user data as output, at operation 525.

Although the methods 300 and 500 are described above and illustrated as being distinct methods, it shall be appreciated that, in some instances, the user data to which the read request received during the performance of method 500 is directed may be the same user data to which the write request received during the performance of the method 300 is directed. That is, the user data read from the memory device by the processing device during the method 500 can be the same user data stored on the memory device during the method 300. Accordingly, in some embodiments, operations of the method 300 can be combined with operations of the method 500. In other words, in some embodiments, a single method (e.g., the method 500) can include any one or more of the operations 305, 310, 315, 320, 405, 410, 415, 420, 505, 510, 515, 520, and 525.

Described implementations of the subject matter can include one or more features, alone or in combination as illustrated below by way of example.

Example 1 is a system including: a memory device; and a processing device coupled to the memory device, the processing device configured to perform operations comprising: receiving a request to write data to the memory device; generating a codeword based on the data, the codeword comprising the data and an error correction code; generating a compressed codeword by compressing the codeword; and storing the compressed codeword on a page of the memory device.

Example 2 includes the system of Example 1, wherein generating the codeword comprises: encoding the data with the error correction code.

Example 3 includes the system of any one or more of Examples 1 or 2, wherein: the compressed codeword is a first compressed codeword; and the operations further comprise: storing a second compressed codeword on the page of the memory device.

Example 4 includes the system of any one or more of Examples 1-3, wherein the operations further comprise: receiving a request to read the data from the memory device; reading, from the page of the memory device, the compressed codeword; decompressing the compressed codeword; decoding the compressed codeword; and providing the data as output responsive to the request.

Example 5 includes the system of any one or more of Examples 1-4, wherein the decoding of the compressed codeword comprises: detecting, based on the error correction code, corrupted data in the data read from the page of the memory device; and correcting the corrupted data using the error correction code.

Example 6 includes the system of any one or more of Examples 1-5, wherein decompressing the compressed codeword includes accessing a compression length in a header of the codeword.

Example 7 includes the system of any one or more of Examples 1-6, wherein the codeword further comprises metadata.

Example 8 includes the system of any one or more of Examples 1-7, wherein the memory device comprises a plurality of pages, each page comprising a set of NAND memory cells.

Example 9 is a method comprising: receiving a request to write data to a memory device; generating a codeword based on the data, the codeword comprising the data and an error correction code; generating a compressed codeword by compressing the codeword; and storing the compressed codeword on a page of the memory device.

Example 10 includes the method of Example 9, wherein generating the codeword comprises: encoding the data with the error correction code.

Example 11 includes the method of any one or more of Examples 9 or 10, wherein: the compressed codeword is a first compressed codeword; and the operations further comprise: storing a second compressed codeword on the page of the memory device.

Example 12 method the system of any one or more of Examples 9-11, wherein the operations further comprise: receiving a request to read the data from the memory device; reading, from the page of the memory device, the compressed codeword; decompressing the compressed codeword; decoding the compressed codeword; and providing the data as output responsive to the request.

Example 13 includes the method of any one or more of Examples 9-12, wherein the decoding of the compressed codeword comprises: detecting, based on the error correction code, corrupted data in the data read from the page of the memory device; and correcting the corrupted data using the error correction code.

Example 14 includes the method of any one or more of Examples 9-13, wherein decompressing the compressed codeword includes accessing a compression length in a header of the codeword.

Example 15 includes the method of any one or more of Examples 9-14, wherein the codeword further comprises metadata.

Example 16 includes the method of any one or more of Examples 9-15, wherein the memory device comprises a plurality of pages, each page comprising a set of NAND memory cells.

Example 17 is a computer-readable storage medium comprising instructions that, when executed by a processing device, configure the processing device to perform operations comprising: receiving a request to write data to a memory device; generating a codeword based on the data, the codeword comprising the data and error correction code; generating a compressed codeword by compressing the codeword; and storing the compressed codeword on a page of the memory device.

Example 18 includes the computer-readable storage medium of Example 17, wherein the operations further comprise: receiving a request to read the data from the memory device; reading, from the page of the memory device, the compressed codeword; decompressing the compressed codeword; decoding the compressed codeword; and providing the data as output responsive to the request.

Example 19 is system comprising: an encoder to generate a codeword, the encoder to generate the codeword by encoding data with error correcting code; a compressor to generate a compressed codeword by compressing the codeword; and a memory device to store the compressed codeword.

Example 20 includes the system of example 19 and further comprises: a decompressor to decompress the compressed codeword read from the memory device; and a decoder to decode the decompressed codeword.

Figure 6:
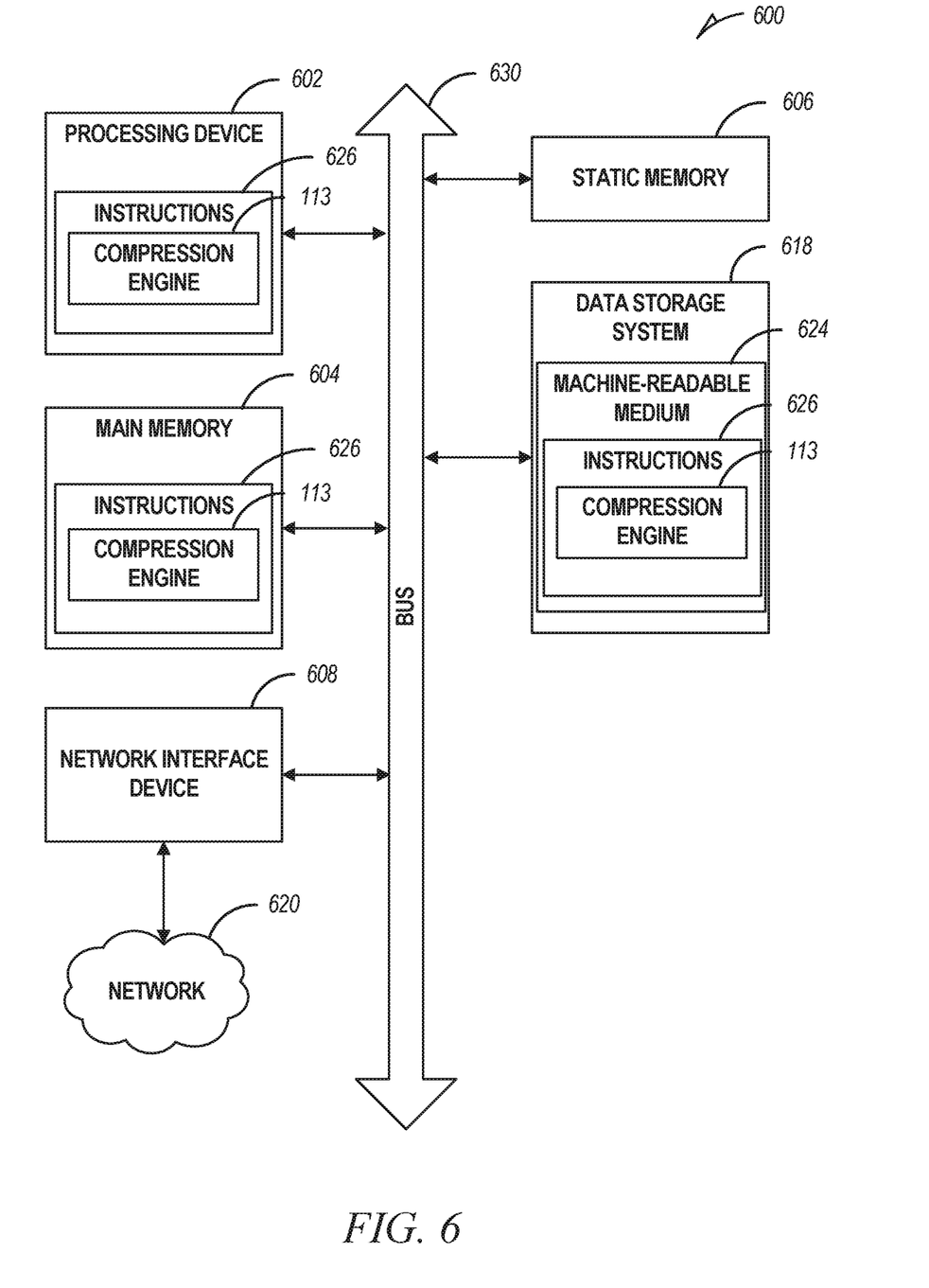
FIG. 6 is a block diagram of an example computer system in which embodiments of the present disclosure may operate.

FIG. 6 illustrates an example machine in the form of a computer system 600 within which a set of instructions can be executed for causing the machine to perform any one or more of the methodologies discussed herein. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the compression engine 113 of FIG. 1). In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., ROM, flash memory, DRAM such as SDRAM or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device 602 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an ASIC, a FPGA, a digital signal processor (DSP), network processor, or the like. The processing device 602 is configured to execute instructions 626 for performing the operations and steps discussed herein. The computer system 600 can further include a network interface device 608 to communicate over a network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a compression engine (e.g., the compression engine 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, etc.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is claimed is:

1. A system comprising:
   a memory device; and
   a processing device coupled to the memory device, the processing device configured to perform operations comprising:
      receiving a request to write data to the memory device;
      storing a first compressed codeword on a page of the memory device, the first compressed codeword being based on a combination of the data and an error correction code; and
      storing a second compressed codeword on the page of the memory device.

2. The system of claim 1, wherein the operations further comprise:
   generating a codeword based on the combination of the data and the error correction code; and
   generating the first compressed codeword based on the codeword.

3. The system of claim 2, wherein generating the codeword comprises adding metadata to the combination of the data and the error correction code.

4. The system of claim 2, wherein generating the codeword comprises encoding the data with the error correction code.

5. The system of claim 1, wherein the operations further comprise:
   receiving a request to read the data from the memory device;
   reading, from the page of the memory device, the first compressed codeword;
   decompressing the first compressed codeword;
   decoding the first compressed codeword; and
   providing the data as output responsive to the request.

6. The system of claim 5, wherein the decoding of the first compressed codeword comprises:
   detecting, based on the error correction code, corrupted data in the data read from the page of the memory device; and
   correcting the corrupted data using the error correction code.

7. The system of claim 5, wherein decompressing the first compressed codeword includes accessing a compression length in a header of a codeword.

8. The system of claim 1, wherein the memory device comprises a plurality of pages, each page comprising a set of NAND memory cells.

9. A method comprising:
   receiving, by a processing device, a request to write data to a memory device;
   storing a first compressed codeword on a page of the memory device, the first compressed codeword being based on a combination of the data and an error correction code; and
   storing a second compressed codeword on the page of the memory device.

10. The method of claim 9, further comprising:
    generating a codeword based on the combination of the data and the error correction code; and
    generating the first compressed codeword based on the codeword.

11. The method of claim 9, wherein generating the codeword comprises adding metadata to the combination of the data and the error correction code.

12. The method of claim 9, wherein generating the codeword comprises encoding the data with the error correction code.

13. The method of claim 9, further comprising:
    receiving a request to read the data from the memory device;
    reading, from the page of the memory device, the first compressed codeword;
    decompressing the first compressed codeword;
    decoding the first compressed codeword; and
    providing the data as output responsive to the request.

14. The method of claim 13, wherein the decoding of the compressed codeword comprises:
    detecting, based on the error correction code, corrupted data in the data read from the page of the memory device; and
    correcting the corrupted data using the error correction code.

15. The method of claim 13, wherein decompressing the compressed codeword includes accessing a compression length in a header of a codeword.

16. The method of claim 9, wherein the memory device comprises a plurality of pages, each page comprising a set of NAND memory cells.

17. A non-transitory computer-readable storage medium comprising instructions that, when executed by a processing device, configure the processing device to perform operations comprising:
    receiving a request to write data to a memory device;
    storing a first compressed codeword on a page of the memory device, the first compressed codeword being based on a combination of the data and an error correction code; and
    storing a second compressed codeword on the page of the memory device.

18. The non-transitory computer-readable storage medium of claim 17, wherein the operations further comprise:
    receiving a request to read the data from the memory device;
    reading, from the page of the memory device, the compressed codeword;
    decompressing the compressed codeword;
    decoding the compressed codeword; and
    providing the data as output responsive to the request.

19. The non-transitory computer-readable storage medium of claim 18, wherein the decoding of the compressed codeword comprises:
    detecting, based on the error correction code, corrupted data in the data read from the page of the memory device; and
    correcting the corrupted data using the error correction code.

20. The non-transitory computer-readable storage medium of claim 18, wherein the operations further comprise:
   generating a codeword based on the data, the error correction code, and metadata, the generating of the codeword comprises adding metadata to a combination of the data and the error correction code; and
generating the first compressed codeword based on the codeword.

\* \* \* \* \*